United States Patent [19]

Nakasuji

[11] 4,158,140

[45] Jun. 12, 1979

[54] ELECTRON BEAM EXPOSURE APPARATUS

[75] Inventor: Mamoru Nakasuji, Yokohama, Japan

[73] Assignee: Tokyo Shibaura Electric Co., Ltd., Japan

[21] Appl. No.: 915,868

[22] Filed: Jun. 15, 1978

[51] Int. Cl.² .............................................. A61K 27/02
[52] U.S. Cl. .................................. 250/492 A; 250/306
[58] Field of Search ................ 250/492 A, 492 R, 306

[56] References Cited

U.S. PATENT DOCUMENTS

| 3,707,765 | 1/1973 | Coleman | 250/492 A |
| 4,122,335 | 10/1978 | Sullivan | 250/492 A |

Primary Examiner—Harold A. Dixon

Attorney, Agent, or Firm—Finnegan, Henderson, Farabow & Garrett

[57] ABSTRACT

Disclosed is an electron beam exposure apparatus which comprises an electron gun to produce an electron beam, a mask plate with an aperture which passes the electron beam and forms a bundle of electron beam components with a sectional shape corresponding to the shape of the aperture, and an electron lens for converging the bundle of electron beam components and applying the bundle to a workpiece. The aperture includes a tapered plane across the thickness of the mask plate, the tapered plane facing the incidence side of the electron beam.

7 Claims, 3 Drawing Figures

ELECTRON BEAM EXPOSURE APPARATUS

BACKGROUND OF THE INVENTION

I. Field of the Invention

This invention relates to an electron beam exposure apparatus, and more particularly to an electron beam exposure apparatus in which an electron beam is passed through an aperture, and projected on a workpiece, having a reduced sectional shape corresponding to the shape of the aperture.

II. Description of the Prior Art

In manufacturing integrated circuit devices, etc., there are used electron beam exposure apparatus for exposing a resist film formed on a wafer to a predetermined pattern. In drawing a pattern with the minimum line width of 1 μm or less by using these apparatus, it is promising that an electron beam emitted from an electron gun is passed through an aperture formed in a mask, condensed, and projected on a resist film as a condensed spot corresponding to the shape of the aperture. In doing this, however, there may be drawn a pattern with a size different from the desired size, due to a proximity effect resulting from scattering of electrons in the resist film during exposure. Such effect is specially remarkable with raster-scanning type exposure apparatus. In order to compensate for the proximity effect, the pattern has conventionally been drawn by using an electron beam having an increased charge density. In the prior art exposure apparatus to attain this, the mask portion around the aperture is formed in the shape of a sharp knife edge, and a wide opening surface of the aperture is directed to the workpiece side, thereby preventing the dispersion of the electron beam within the thickness of the mask. Although the exposure profile of the electron beam obtained by means of these exposure apparatus is substantially ideal, that is rectangular, it is still subject to a bad influence of the proximity effect.

SUMMARY OF THE INVENTION

An object of this invention is to provide an electron beam exposure apparatus capable of high-accuracy patterning by compensating for the proximity effect.

Another object of the invention is to provide an electron beam exposure apparatus capable of projecting on a workpiece an electron beam spot with higher electron density in the peripheral portion as compared with the central portion.

These and other objects which will be apparent from the following detailed description have been attained according to this invention by an electron beam exposure apparatus comprising an electron gun to produce an electron beam, a mask plate having an aperture which passes the electron beam and forms a bundle of electron beam components with a sectional shape corresponding to the shape of the aperture, the aperture including a tapered plane across the thickness of the mask plate, the tapered plane facing the incidence side of the electron beam, and a means for converging the bundle of electron beam components and projecting the bundle onto a workpiece.

DETAILED DESCRIPTION OF THE PREFERRED EMBODIMENTS

This invention will now be described in detail with reference to the accompanying drawings.

Figure 2:
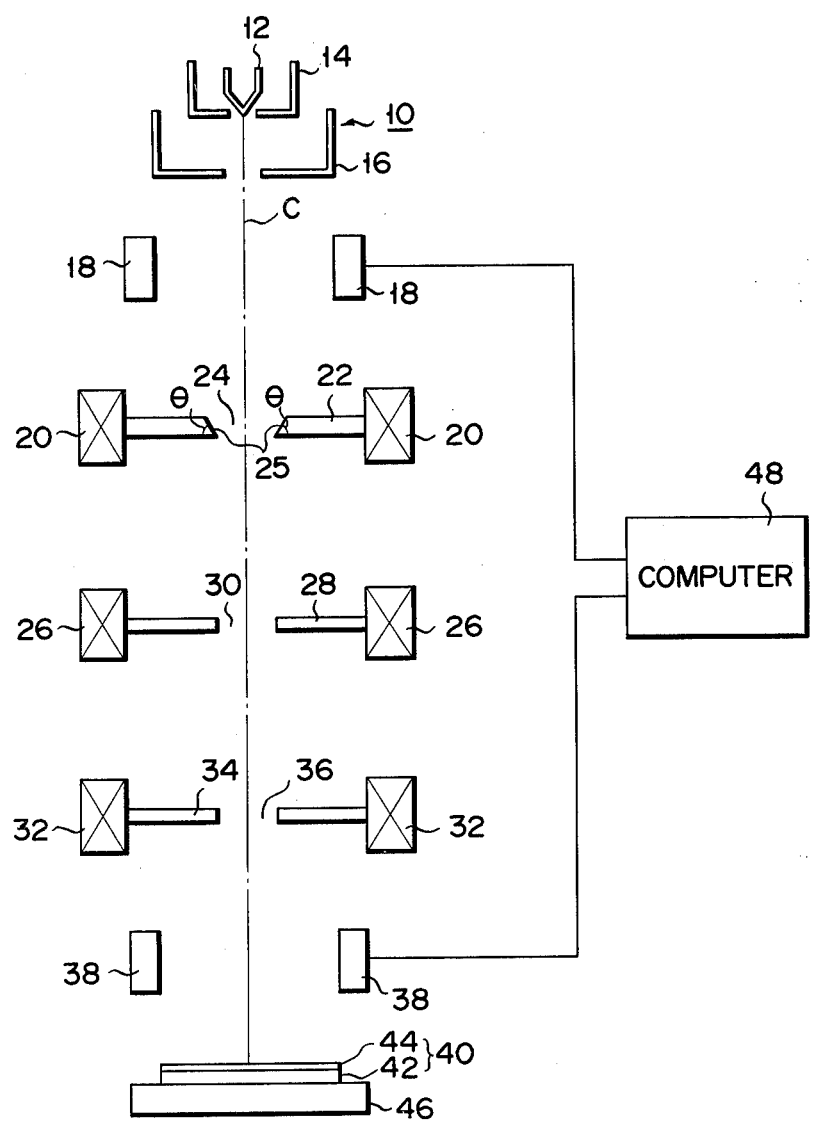
FIG. 2 is a schematic view showing an embodiment of the electron beam exposure apparatus according to the invention.

As shown in FIG. 2, the electron beam exposure apparatus according to this invention includes an electron gun 10 composed of a cathode 12, a Wehnelt cylinder 14 and an anode 16. An electron beam emitted from the electron gun 10 passes through an electron lens 20 including an integrally built-in mask plate 22 with an aperture 24 as hereinafter mentioned in detail, and reaches a condensing electron lens 26 as a beam with the sectional shape corresponding to the plane shape of the aperture 24. Built in the condensing electron lens 26 is a mask plate 28 with an aperture 30. The electron beam which has passed through the electron lens 20 passes only through the aperture 30, while other electron beam components are intercepted by the mask plate 28. The electron beam condensed by the electron lens 26 is projected on an object electron lens 32 including a built-in mask plate 34 with a similar aperture 36. Then, the electron beam is converged by the object electron lens 32, and applied to a workpiece 40, such as an electroresist film 44 formed on a silicon wafer 42, as a condensed spot similar to the plane shape of the aperture 24 and with higher electron density in the peripheral portion as compared with the central portion.

Patterning is performed by the cooperation of a blanking electrode 18 for blanking the electron beam and a deflecting electrode 38 for deflecting the electron beam after having passed through the object electron lens 32, both controlled by a computer 48. The workpiece 40 is mounted on a support plate 36, which may be moved in two perpendicular directions by a suitable means in patterning. This patterning system is mentioned in a lot of literature, such as E. V. Weber and H. S. Yourke, "Electronics", Nov. 1977.

The aperture 24 in the mask plate 22 built in the electron lens 20 includes a tapered plane 25 across the thickness of the mask plate 22, as illustrated, and the tapered plane 25 faces the incidence side of the electron beam. Angle θ formed between the base of the mask plate 22 or a segment perpendicular to an optical axis C and the tapered plane 25 generally ranges from 45° to less than 90°, preferably 54° to 85°. The plane shape of the aperture 24 is generally square or circular, though not limited to this. The size of the aperture 24 may be determined as required.

Figure 1:
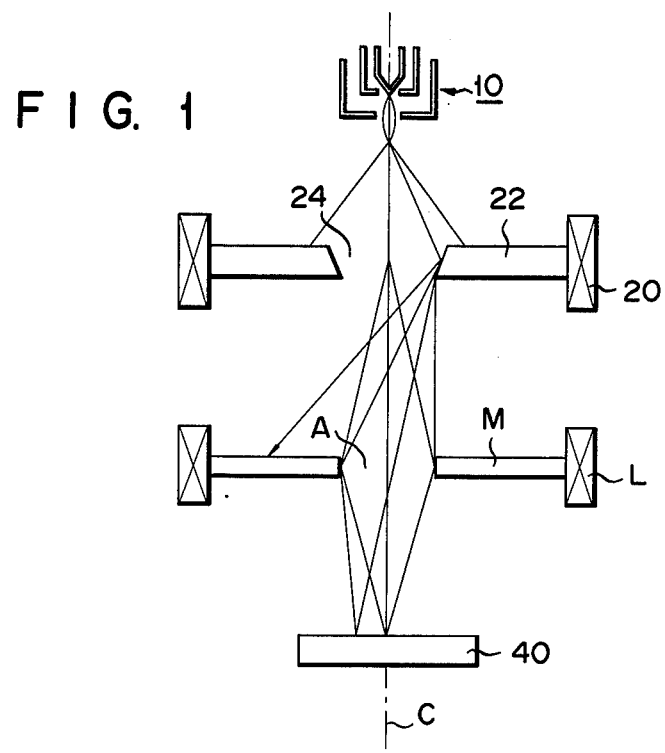
FIG. 1 illustrates the principle of this invention.
Figure 3:
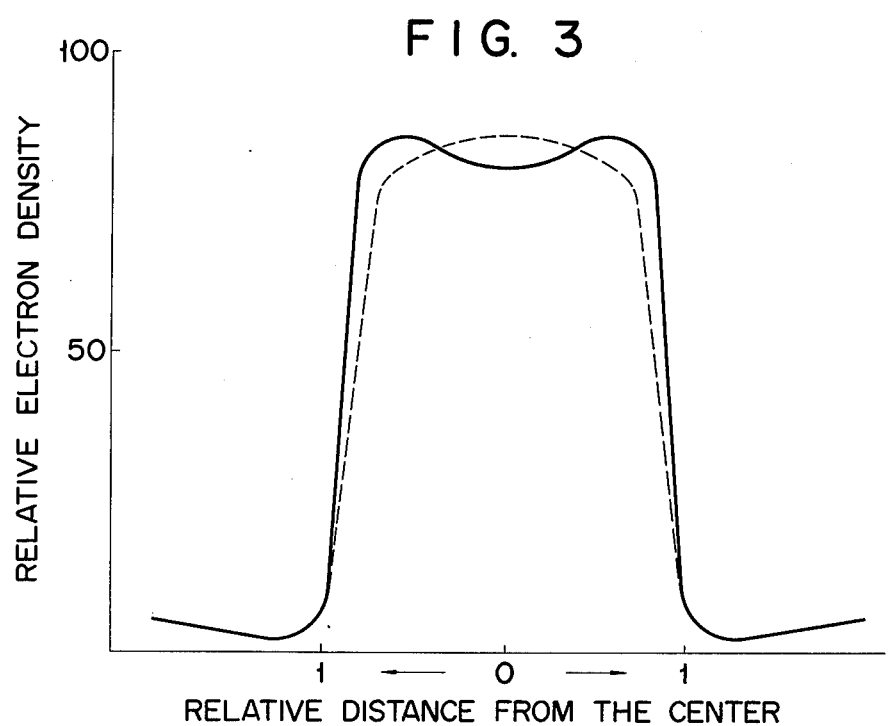
FIG. 3 is a graph showing the electron density distribution across the center of an electron beam spot formed by means of the electron beam exposure apparatus of the invention.

As stated above, the electron beam spot applied to the workpiece 40 by means of the exposure apparatus of this invention has higher electron density in the peripheral portion as compared with the central portion. This will be described with reference to FIG. 1, in which only one of the electron lenses following the mask plate 22 is shown, for the simplicity of illustration. Out of the electron beam emitted from the electron gun 10, components which have passed through the aperture 24 without being interrupted by the mask plate 22 are converged by an electron lens L, and applied to the workpiece 40 with the same electron density. On the other hand, electron beam components which have passed through the aperture 22 after being scattered on the tapered plane 25 of the aperture 22 are angled, so that they are applied to the peripheral portion of an aperture A of a mask plate M built in the electron lens L, converged by the electron lens L, and projected on the workpiece 40, excepting those components which are interrupted by the mask plate M. Accordingly, the electron beam spot projected on the workpiece 40 becomes higher in the electron density in the peripheral portion than in the central portion, because the aforesaid electron components that are scattered on the tapered plane 25 are superimposed in the peripheral portion. FIG. 3 shows by a solid line the electron density distribution across the center of the thus projected electron beam spot. The broken line indicates the electron density distribution of an electron beam spot obtained by means of the prior art beam exposure apparatus which has the mask plate with the knife-edged aperture as initially described. As may be seen from FIG. 3, the electron density of the electron beam spot obtained by means of the exposure apparatus of this invention is higher in the peripheral portion, and besides exhibits steep rising.

According to the exposure apparatus of this invention, as mentioned above, applied to the workpiece is the electron beam spot with higher electron density in the peripheral portion as compared with the central portion, the proximity effect may be compensated for. In developing, any portion of an electroresist film subjected to irradiation exceeding a fixed level will not be etched. Since, according to the prior art apparatus, the electron density in the peripheral portion is lower than that in the central portion, and the rising is gentler, no accurate pattern may be obtained by etching without the closest control. By using the exposure apparatus of the invention, however, an accurate pattern may be obtained without so strict control because of the higher electron density in the peripheral portion as compared with the central portion as well as the steep rising.

Thus, according to the apparatus of this invention, the proximity effect of the aperture may be compensated for without requiring any sophisticated operations, such as the control of the scanning density of the electron beam. Also, this can easily be attained by tapering the edge of the aperture 22 so as to face the incidence side of the electron beam. Consequently, there may be obtained immeasurable effects, such as the ease of high-accuracy patterning.

According to an experiment made by the present inventor, patterning with the minimum exposure width of 1 μm by raster scanning was not adversely affected by the proximity effect, ensuring satisfactory exposure. Moreover, when a pattern was drawn on a positive-working resist, the sectional shape of the resist was found to be substantially rectangular, and the variation in the pattern size could be limited to 0.2 μm or less even with a 10% variation of the electron beam intensity. The same results could be obtained with respect to vector scanning.

Further, a beam corresponding only to the overlapping portion of the several apertures may be formed by interposing a deflecting electrode between two mask plates similar to the mask plate 22.

What is claimed is:

1. An electron beam exposure apparatus comprising:
    an electron gun to produce an electron beam;
    a mask plate having an aperture which passes said electron beam and forms a bundle of electron beam components with a sectional shape corresponding to the shape of said aperture, said aperture including a tapered plane across the thickness of said mask plate, said tapered plane facing the incidence side of said electron beam; and
    a means for converging said bundle of electron beam components and applying said bundle to a workpiece.

2. An apparatus according to claim 1, wherein said tapered plane is inclined at an angle ranging from 45° to less than 90° as compared with the direction perpendicular to the optical axis.

3. An apparatus according to claim 2 wherein said angle is 54° to 85°.

4. An apparatus according to claim 2, wherein said means for converging said bundle of electron beam includes at least one electron lens.

5. An apparatus according to claim 4, wherein a blanking electrode for blanking the electron beam is interposed between said electron gun and said mask plate.

6. An apparatus according to claim 5, wherein said mask plate is built in an electron lens.

7. An apparatus according to claim 5 or 6, comprising a deflecting electrode for deflecting said bundle of electron beam which is disposed next to said means for converging said bundle of electron beam.

* * * * *

UNITED STATES PATENT AND TRADEMARK OFFICE
CERTIFICATE OF CORRECTION

PATENT NO. : 4,158,140
DATED : June 12, 1979
INVENTOR(S) : MAMORU NAKASUJI

It is certified that error appears in the above—identified patent and that said Letters Patent are hereby corrected as shown below:

On First Page, the Assignee appears incorrect. It should read: -- Assignee: VLSI Technology Research Association Japan

*Signed and Sealed this*

*Eighth* Day of *April 1980*

[SEAL]

*Attest:*

SIDNEY A. DIAMOND

*Attesting Officer*      *Commissioner of Patents and Trademarks*

UNITED STATES PATENT AND TRADEMARK OFFICE
CERTIFICATE OF CORRECTION

PATENT NO. : 4,158,140
DATED : June 12, 1979
INVENTOR(S) : Mamoru Nakasuji

It is certified that error appears in the above—identified patent and that said Letters Patent is hereby corrected as shown below:

On the title page, Item [30] should read:

June 15, 1977　　　Japan　　　52-70626

Signed and Sealed this

Fifteenth Day of July 1980

[SEAL]

Attest:

SIDNEY A. DIAMOND

Attesting Officer　　　Commissioner of Patents and Trademarks